US009123501B2

(12) United States Patent
Fukuda et al.

(10) Patent No.: US 9,123,501 B2
(45) Date of Patent: Sep. 1, 2015

(54) DEVICE FOR CORRECTING DIFFRACTION ABERRATION OF ELECTRON BEAM

(75) Inventors: Muneyuki Fukuda, Tokyo (JP); Yoichi Ose, Tokyo (JP); Mitsugu Sato, Tokyo (JP); Hiroyuki Ito, Tokyo (JP); Hiroshi Suzuki, Tokyo (JP); Naomasa Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/977,139

(22) PCT Filed: Dec. 26, 2011

(86) PCT No.: PCT/JP2011/007244
§ 371 (c)(1),
(2), (4) Date: Jan. 16, 2014

(87) PCT Pub. No.: WO2012/090464
PCT Pub. Date: Jul. 5, 2012

(65) Prior Publication Data
US 2014/0124664 A1 May 8, 2014

(30) Foreign Application Priority Data
Dec. 28, 2010 (JP) ................................. 2010-291519

(51) Int. Cl.
*H01J 37/14* (2006.01)
*H01J 37/26* (2006.01)
*H01J 37/10* (2006.01)
*H01J 37/153* (2006.01)
*H01J 37/147* (2006.01)

(52) U.S. Cl.
CPC ............... *H01J 37/10* (2013.01); *H01J 37/147* (2013.01); *H01J 37/153* (2013.01); *H01J 37/26* (2013.01); *H01J 2237/1534* (2013.01); *H01J 2237/2614* (2013.01)

(58) Field of Classification Search
CPC ........... H01J 3/12; H01J 29/56; H01J 29/566; H01J 37/02; H01J 37/04; H01J 37/10; H01J 37/14; H01J 37/143; H01J 37/1471; H01J 37/153; H01J 37/26; H01J 37/261; H01J 37/28; H01J 2229/563; H01J 2229/5632; H01J 2229/5635
USPC ................................. 250/306, 307, 310, 311
See application file for complete search history.

(56) References Cited

U.S. PATENT DOCUMENTS 3,569,698 A * 3/1971 Herrman ....................... 250/398
5,838,011 A * 11/1998 Krijn et al. ................. 250/396 R
(Continued)

FOREIGN PATENT DOCUMENTS

| JP | 63-114032 A | 5/1988 |
|---|---|---|
| JP | 2005-302437 A | 10/2005 |
| JP | 2007-207764 A | 8/2007 |

OTHER PUBLICATIONS

Rose, H., "Calculation of an Electron-Optical Apochromatic Lens", Optik 31 (1970), pp. 144-164.

*Primary Examiner* — Nicole Ippolito
*Assistant Examiner* — David E Smith
(74) *Attorney, Agent, or Firm* — Miles & Stockbridge P.C.

(57) ABSTRACT

A diffraction aberration corrector formed by the multipole of the solenoid coil ring and having a function of adjusting the degree of orthogonality or axial shift of the vector potential with respect to the beam axis. In order to cause a phase difference, the diffraction aberration corrector that induces a vector potential, which is perpendicular to the beam axis and has a symmetrical distribution within the orthogonal plane with respect to the beam axis, is provided near the objective aperture and the objective lens. A diffracted wave traveling in a state of being inclined from the beam axis passes through the ring of the magnetic flux. Since the phase difference within the beam diameter is increased by the Aharonov-Bohm effect due to the vector potential, the intensity of the electron beam on the sample is suppressed.

10 Claims, 13 Drawing Sheets

$$\Delta \phi(\vec{r}, \vec{R}) = \frac{2\pi}{\lambda} \frac{\vec{r} \cdot \vec{R}}{F} = \frac{2\pi \alpha}{\lambda a} \vec{r} \cdot \vec{R}$$

(56) References Cited

U.S. PATENT DOCUMENTS

| | | |
|---|---|---|
| 2002/0079448 A1 | 6/2002 | Ishitani et al. |
| 2006/0113473 A1* | 6/2006 | Taniguchi et al. ............ 250/310 |
| 2007/0114403 A1* | 5/2007 | Hosokawa .................... 250/310 |
| 2007/0181806 A1* | 8/2007 | Nakano et al. ................ 250/310 |
| 2009/0039281 A1* | 2/2009 | Kawasaki et al. ......... 250/396 R |
| 2010/0181478 A1* | 7/2010 | Morokuma et al. .......... 250/307 |

* cited by examiner

DEVICE FOR CORRECTING DIFFRACTION ABERRATION OF ELECTRON BEAM

TECHNICAL FIELD

The present invention relates to a technique for manufacturing a substrate having a fine circuit pattern, such as a semiconductor device, a liquid crystal, and a magnetic recording medium, and in particular, to a charged particle beam microscope and an inspection method for observing, measuring, and inspecting a fine circuit pattern using a charged particle beam.

BACKGROUND ART

With the miniaturization and integration of semiconductor devices, the miniaturization of a circuit pattern is going on in the management or development of the manufacturing process, so that the size of a hole or a groove formed on the wafer is about 10 nm in the case of a fine hole or groove. For this reason, demands for measuring a fine pattern having a size of tens of nanometers with high accuracy and at high speed are increasing more and more. In order to meet the demands of nano-resolution observation that cannot be addressed by the optical microscope, the probe diameter of the electron beam of a scanning electron microscope (hereinafter, referred to as an SEM) has been reduced year by year to about nm. This SEM is a high-resolution observation image acquisition means next to a scanning probe microscope (hereinafter, referred to as an SPM) having atomic resolution.

However, restrictions on the use represented by the damage to a sample are an obstacle to expanding its applicability. For example, a critical dimension scanning electron microscope (hereinafter, referred to as a CD-SEM) is an essential measuring apparatus in semiconductor lithography management, but the damage to the resist by the electron beam is an obstacle to measurement. As effective means for reducing this damage, measurement at 100 eV or less has been proposed. Thus, electron beam of ultra-low acceleration voltage is required for low damage observation of soft materials. However, it is not possible to obtain the desired resolution with the electron beam of ultra-low acceleration voltage since optical aberration and a diffraction aberration are increased. The optical aberration correction is an aberration caused geometrically and optically by a lens or the like of the electron optical system, and has a feature that the aberration increases as the opening angle of the beam on a sample increases. On the other hand, the diffraction aberration is an aberration caused by the wave nature of electrons, and has a feature that the aberration increases as the opening angle of the beam on a sample decreases. Assuming that the allowable range of the sample height at which the resolution is degraded by 10% is the depth of focus of an observation image, the depth of focus increases as the beam opening angle on the sample decreases.

As a basic principle of an optical aberration correction method, NPL 1 discloses a method of correcting a chromatic aberration, among optical aberrations, by creating the straight-through condition of Wien filters by multiple poles when the electric field and the magnetic field are superimposed.

As a basic principle of annular illumination, PTL 1 discloses a scanning charged particle beam microscope characterized in that a passage opening to restrict the passage of a charged particle beam is disposed between a charged particle source and a scanning deflector and the passage opening includes a member, which restricts the passage of a charged particle beam, at the center of the opening.

In order to efficiently obtain the multivalent ion beam of the microwave ion source, PTL 2 discloses a method for realizing stable beam extraction by arranging a solenoid coil and a magnet array in the ion source plasma chamber and confining the plasma so that the magnetic field strength is minimum in a central plasma portion on the average in both the axial direction and the radial direction when the combined magnetic field shape is seen from the plasma side.

In order to perform adjustment easily with little change of the electron orbit by reducing the power of the energy filter of the electron microscope, PTL 3 discloses a magnet in which auxiliary coils for adjusting the balance, which are independent of and adjacent to main coils, are wound in a solenoid shape with pole pieces of the upper and lower portions interposed therebetween and which generates a magnetic field in a pole piece gap.

In addition to the SEM, a transmission electron microscope (hereinafter, referred to as a TEM), a scanning transmission electron microscope (hereinafter, referred to as an STEM), and the like are included in apparatuses that perform observation, measurement, and inspection using a charged particle beam. As a common feature of structures of these optical systems, the spherical aberration and the chromatic aberration have been dominant factors in the resolution degradation. That is, since the spherical aberration has been a dominant factor rather than the chromatic aberration in the STEM or the TEM and the chromatic aberration has been a dominant factor rather than the spherical aberration in the SEM, optical aberration correction techniques optimized for the respective microscopes have been developed. By the appearance of these optical aberration correction techniques, aberrations of the entire optical system are suppressed, and a diffraction aberration is now a dominant factor in the resolution degradation as a common feature of the structures of the optical systems.

CITATION LIST

Patent Literature

PTL 1: JP-A-2007-207764
PTL 2: JP-A-63-114032
PTL 3: JP-A-2005-302437

Non Patent Literature

NPL 1: H. Rose, Optik, 31 (1970) 144

SUMMARY OF INVENTION

Technical Problem

In the conventional technique disclosed in NPL 1, the optical aberration can be corrected, but the diffraction aberration cannot be corrected. Since the optical aberration correction has a feature that the aberration increases as the opening angle of the beam on a sample increases and the diffraction aberration has a feature that the aberration increases as the opening angle of the beam decreases, it is possible to suppress the aberration by the optical aberration correction if the opening angle of the beam is increased. If the opening angle of the beam is increased, the depth of focus may become shallow. As a result, the top surface or the bottom of a groove or a hole on the sample may not be able to be observed simultaneously, or detection of the in-focus position may become difficult. The observation image with shallow depth of focus becomes an inconvenient observation image, with which it is difficult to obtain three-dimensional information, compared with a conventional SEM image.

In the conventional technique disclosed in PTL 1, it is not possible to control the diffraction aberration. For this reason, a plurality of intensity peaks are formed in the beam intensity distribution on a sample. In addition, by applying an appropriate optical aberration, it is possible to increase the depth of focus to some extent without changing the opening angle of the beam on the sample. However, the effect is limited.

In the conventional technique disclosed in PTL 2, it is possible to realize stable beam extraction by arranging the solenoid coil and the magnet array in the ion source plasma chamber and confining the plasma, but the diffraction aberration of a charged particle cannot be corrected.

In the conventional technique disclosed in PTL 3, the energy filter of the electron microscope can be realized by arranging the magnet that generates a magnetic field in a pole piece gap by winding coils in a solenoid shape with pole pieces of the upper and lower portions interposed therebetween, but the diffraction aberration of an electron beam cannot be corrected.

Solution to Problem

There are Rayleigh diffraction and wavefront aberration in the diffraction aberration in charged particle optics. The characteristics of the aberration and the aberration correction method in the Rayleigh diffraction in electron optics will be described below.

If the beam orbit is limited by the objective aperture, in order to control the opening angle of the beam on a sample with an objective lens, the wave nature of electrons becomes strong. As a result, diffraction occurs. The phenomenon of spot form expansion of the beam on a sample by the above diffraction is the Rayleigh diffraction. The intensity distribution of the diffracted wave on the sample changes due to the phase difference within the beam diameter caused by the traveling direction of the electron beam. As the inclination of the traveling direction of the electron beam by diffraction from the beam axis increases, the intensity distribution of the diffracted wave on the sample is attenuated. However, for the low acceleration beam, since the wavelength of the electron beam is increased, a phase difference within the beam diameter according to the traveling direction is less likely to occur. Accordingly, attenuation of the intensity distribution of the diffracted wave becomes weak. For this reason, the diffraction aberration increases as the acceleration level becomes low.

Next, the Aharonov-Bohm effect (hereinafter, referred to as AB effect) used for phase control of the electron beam will be described.

Y. Aharonov and David Bohm predicted theoretically the phenomenon (hereinafter, referred to as AB effect) in which the phase of the electron beam changes even if there is no magnetic field or electric field in 1959 (Phys. Rev. 115 (1959) 485), and Tonomura et al. demonstrated it using the technique of electron beam holography in 1986 (Phys. Rev. Lett. 56 (1986) 792). Since it is difficult to satisfy the condition, in which no magnetic field or electric field is present, in a solenoid coil with a limited length, it has been necessary to suppress the magnetic field leakage by forming the solenoid coil in a donut-shaped ring and make the solenoid coil very fine (several micrometers) because the wavelength of the electron beam is extremely short. In the above-described demonstration, the magnet of a very fine ring was surrounded with a superconducting material so that the leakage of the magnetic field of the magnet was completely prevented by the Meissner effect, and the phase difference between electron beams passing through the inner and outer sides of the ring was observed in the form of interference fringes using electron beam holography. As a result of the observation, it was found that the phase difference of a half wavelength was present between the orbits of two electron beams, and it was demonstrated that the phase of the electron beam was changed by the vector potential.

The Rayleigh diffraction can be suppressed by efficiently causing a phase difference within the beam diameter by the inclination of the traveling direction of the electron beam from the beam axis. Therefore, in order to cause the above-described phase difference, a diffraction aberration corrector that induces a vector potential, which is perpendicular to the beam axis and has a symmetrical distribution within the orthogonal plane, is provided between the objective aperture and the objective lens. The intensity of the electron beam on the sample does not change without a change in the phase difference of the electron beam traveling along the beam axis. However, a diffracted wave, which travels in a state of being inclined from the beam axis due to Fresnel diffraction on the electron beam path, increases the phase difference within the beam diameter by the AB effect due to the vector potential. As a result, it is possible to suppress the intensity of the electron beam on the sample. However, the electron beam focused on the sample by the objective lens travels while causing a diffracted wave. The phenomenon of spot form expansion of the beam on the sample by the above diffraction is the Rayleigh diffraction. The intensity distribution of the diffracted wave on the sample changes due to the phase difference within the beam diameter caused by the focusing direction of the electron beam. As the inclination of the focusing direction of the electron beam by diffraction from the beam axis increases, the intensity distribution of the diffracted wave on the sample is attenuated with an amplitude variation. It is difficult to cause a phase difference within the beam diameter efficiently for the electron beam focused by the objective lens. Therefore, for a diffracted wave of the electron beam before passing through the objective lens, a phase difference from the beam axis is efficiently caused by the inclination from the beam axis. In this case, since a phase difference between diffracted waves before and after the objective lens occurs, it is possible to suppress the Rayleigh diffraction.

An example of the configuration of the diffraction aberration corrector will be described below. A desired vector potential distribution can be obtained by arranging the solenoid coil rings or the magnet rings at the positions on the same circumference around the beam axis, which are symmetrical with respect to the beam axis, so that the extension direction of the ring surface faces the beam axis. For example, when four solenoid coil rings are used, the above is realized by arranging a pair of solenoid coil rings so that the extension direction of two ring surfaces disposed at the symmetrical positions crosses the beam axis and the induced vector potential is rotationally symmetrical with respect to the beam axis and also arranging another pair of solenoid coil rings at the positions, at which the relative angles are 90°, so that the directions of the vector potentials of the pair of solenoid coil rings are rotationally symmetrical and the directions of the vector potentials of the adjacent solenoid coil rings are axisymmetrical. In addition, rotational symmetry of the vector potential becomes better by using solenoid coil rings of a multiple of 4, such as 8 or 12, on the same circumference around the beam axis. In addition, the rotational symmetry of the vector potential becomes better by forming a ring rotating around the beam axis with a cylinder obtained by spirally winding the solenoid coil.

Advantageous Effects of Invention

According to the present invention, in the charged particle beam microscope to observe, measure, and inspect a fine circuit pattern using a charged particle beam, it is possible to suppress the diffraction aberration on the sample by increasing the phase difference within the beam diameter of the vector potential.

DESCRIPTION OF EMBODIMENTS

As an example, in the following embodiment, an example of application of apparatus using a scanning electron microscope will be described. However, means for correcting the diffraction aberration in each embodiment can be generally applied to charged particle beam apparatuses including not only an electron beam apparatus but also an ion beam apparatus. In addition, in the following embodiment, an apparatus having a semiconductor wafer as a sample will be described. However, as samples used in various kinds of charged particle beam apparatuses, not only the semiconductor wafer but also various kinds of samples, such as a semiconductor substrate, a fragment of a wafer on which a pattern is formed, a chip cut out from the wafer, a hard disk, and a liquid crystal panel, can be inspected and measured.

First Embodiment

In a first embodiment, an example of application to a scanning electron microscope will be described.

The scanning electron microscope of the present embodiment is configured to include an electron optical system formed in the vacuum housing, an electron optical system control device disposed around the electron optical system, a host computer that performs overall control of the entire apparatus by controlling each control unit included in a control power supply, a console connected to the control device, and display means including a monitor that displays an acquired image. The electron optical system control device is formed by a power supply unit for supplying a current and a voltage to each component of the electron optical system, a signal control line for transmitting a control signal to each component, and the like. In the present embodiment, the scanning electron microscope is set as an example of an application. However, the present invention may also be applied to an ion microscope, a transmission electron microscope, a reflection electron microscope, or a mirror electron microscope, for example.

Figure 1:
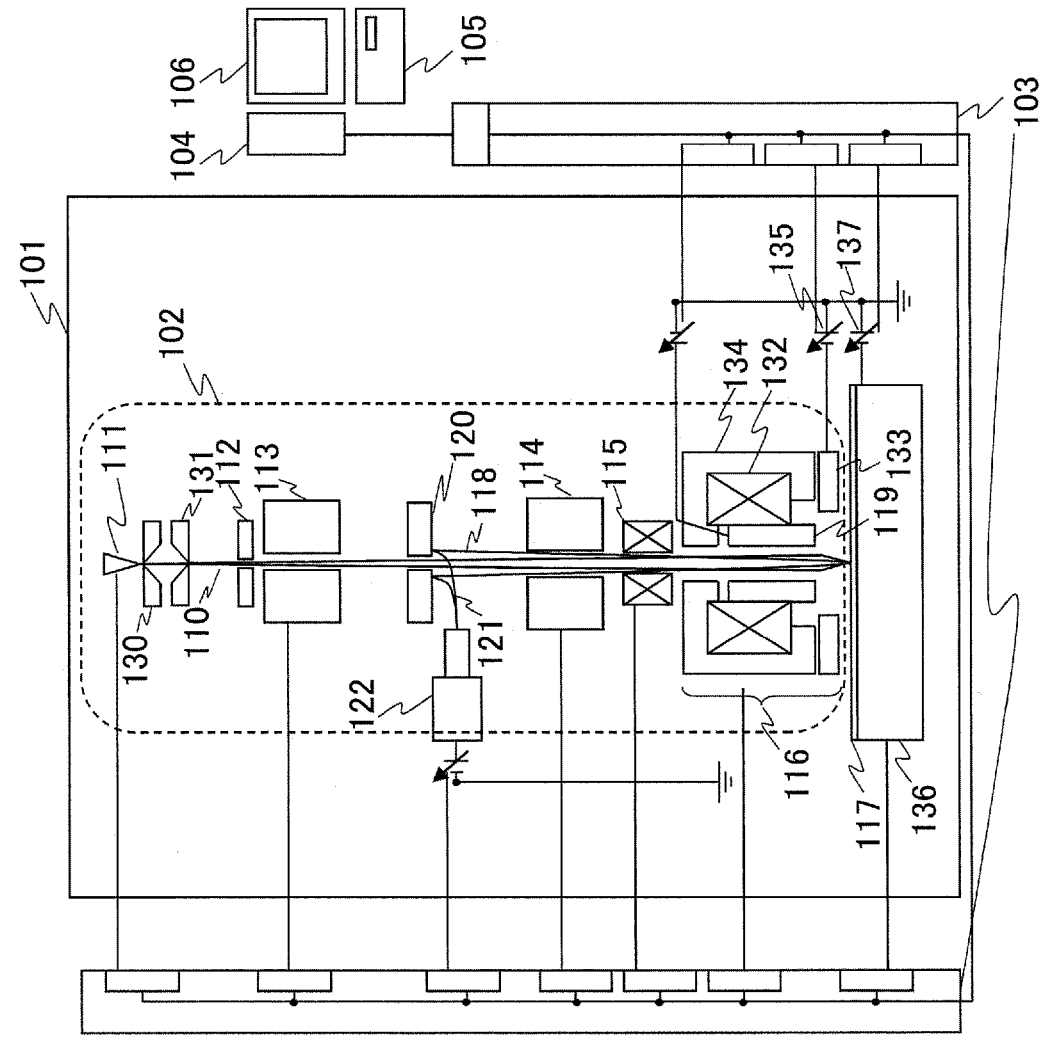
FIG. 1 is a diagram showing an embodiment in which a diffraction aberration corrector is applied to a scanning electron microscope.

FIG. 1 is a schematic diagram showing the overall configuration of the scanning electron microscope of the present invention. The scanning electron microscope of the present embodiment is configured to include an electron optical system 102 formed in a vacuum housing 101, an electron optical system control device 103 disposed around the electron optical system 102, a host computer 104 that performs overall control of the entire apparatus by controlling each control unit included in a control power supply, a console 105 connected to the control device, and display means 106 including a monitor that displays an acquired image. The electron optical system control device 103 is formed by a power supply unit for supplying a current and a voltage to each component of the electron optical system 102, a signal control line for transmitting a control signal to each component, and the like. Here, the host computer 104 that performs overall control of the entire apparatus may be of any type. For example, the host computer 104 may be connected to a communication system or a system that transports a wafer as a sample to be observed from the wafer storage cassette to the sample chamber.

The electron optical system 102 is configured to include an electron source 111 that generates an electron beam 110, an objective aperture 112 that limits the beam diameter of the electron beam 110, an aberration corrector 113 that controls the optical aberration of the electron beam 110, a diffraction aberration corrector 114 that controls the diffraction aberration of the electron beam 110, a deflector 115 that deflects the primary electron beam, a combined immersion lens of magnetic field and electrostatic field 116 that focuses the electron beam 110, a booster magnetic path member 119 that focuses and diverges a secondary particle 118, which is emitted from a sample 117 held on the stage, a reflecting member 120 with which the secondary particle 118 collides, and a central detector 122 that detects a third particle 121 re-emitted by the collision. The reflecting member 120 is formed by a disc-shaped metal member in which an opening, through which the electron beam 110 passes, is formed, and the bottom surface forms a secondary particle reflecting surface.

The electron beam 110 emitted from the electron source 111 is accelerated by the potential difference formed between an extraction electrode 130 and an acceleration electrode 131 and reaches the combined immersion lens of magnetic field and electrostatic field 116. The combined immersion lens of magnetic field and electrostatic field 116 focuses the incident electron beam 110 by exciting the magnetic field on the sample 117 using a coil 132. A negative electric potential with respect to the electric potential of a yoke member 134 is supplied to a control magnetic path member 133, and this electric potential is supplied by a control magnetic path power supply 135. In addition, an electric potential is applied to a stage 136 by a stage power supply 137 so that the potential difference between this electric potential and the electric potential of the booster magnetic path member 119 becomes negative. For this reason, the electron beam 110 having passed through the booster magnetic path member 119 is abruptly decelerated to reach the sample surface. Here, since the landing energy of the electron beam 110 is determined only by the potential difference between the electron source 111 and the stage 136, if the electric potential applied to the electron source 111 and the stage 136 is controlled to have a predetermined value, the landing energy of the electron beam 110 can be controlled to be a desired value regardless of the electric potential applied to the booster magnetic path member 119 or the acceleration electrode 131. Here, the combined immersion lens of magnetic field and electrostatic field 116 may be of any type. For example, it may be the combined immersion lens of magnetic field and electrostatic field 116 without the control magnetic path member 133, a magnetic lens, or an electrostatic lens.

In the diffraction aberration corrector 114, poles of vector potentials formed by the cylindrical pipe to form a solenoid coil in a doughnut-shaped ring or a solenoid coil ring are disposed at the positions on the same circumference around the beam axis, which are symmetrical with respect to the beam axis of the electron beam 110 having passed the objective aperture 112, so that the extension direction of the surface of the solenoid coil ring crosses the beam axis, another pair of poles of vector potentials are disposed at the positions, at which the relative angles with respect to the poles of the two vector potentials are 90° so that the extension direction of the surface of the solenoid coil ring crosses the beam axis, and the ring direction of the magnetic flux induced in the solenoid coil by the pair of poles of each vector potential is set so as to be rotationally symmetrical with respect to the beam axis and the ring direction of the magnetic flux induced in the solenoid coil by the poles of the adjacent vector potential is set so as to be axisymmetrical with respect to the beam axis. Here, the configuration of the multipole of the vector potential of the diffraction aberration corrector 114 may be an octapole, 12-pole, or consecutive pole other than the quadrupole. In addition, the pole of the vector potential may be a magnet ring or the like other than the solenoid coil. Moreover, in addition to the multipole of the vector potential, a condenser lens may be provided in the diffraction aberration corrector 114. Any type of optical aberration corrector 113 may be used as long as it is a device for correcting the optical aberration of the electron beam 110. In general, the optical aberration corrector 113 is formed by multiple poles of a magnetic pole and an electrode and a condenser lens.

Figure 2:
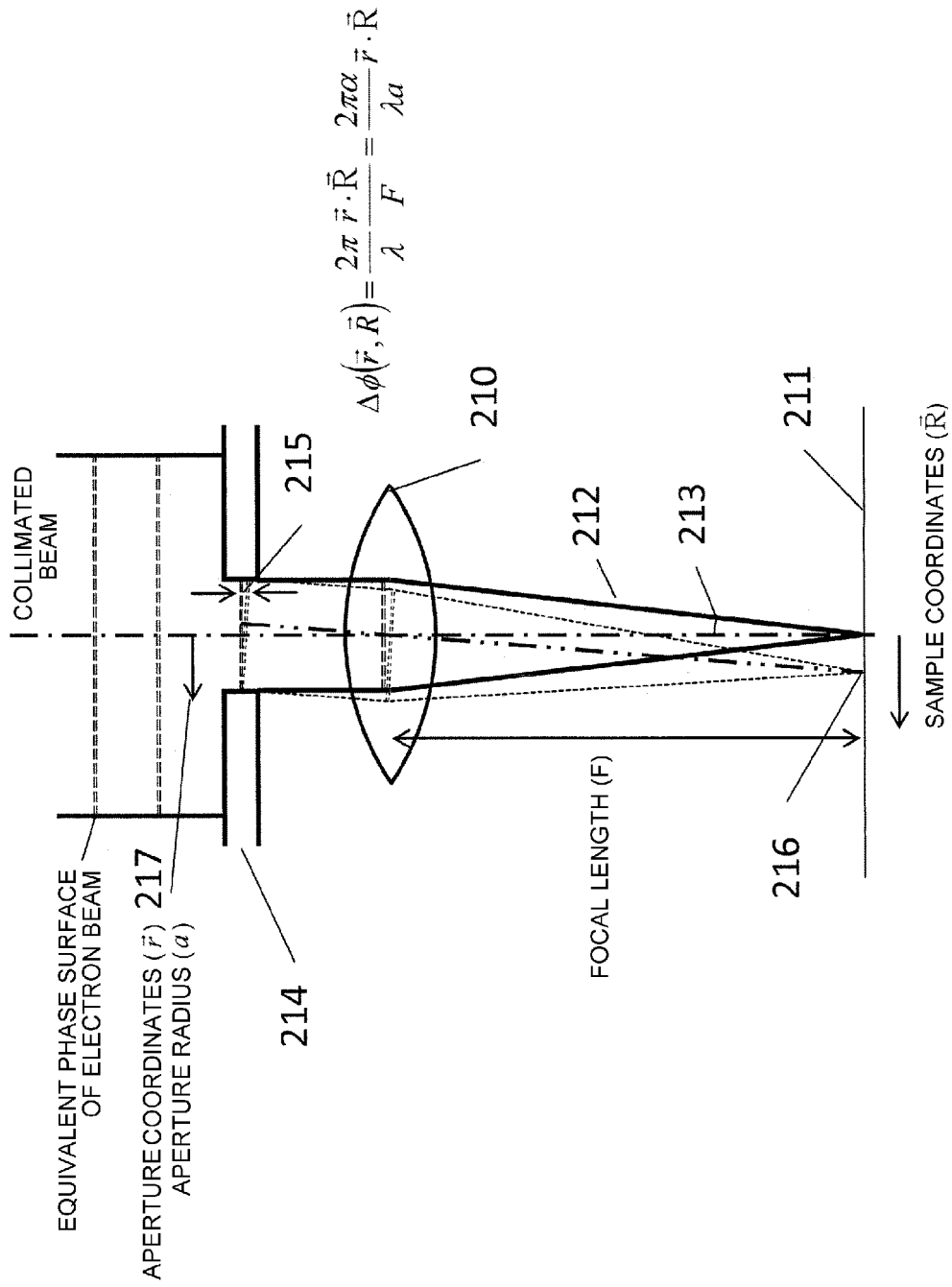
FIG. 2 is a schematic diagram of the diffraction aberration in the scanning electron microscope.

FIG. 2 is a schematic diagram of the diffraction aberration in a scanning electron microscope. Although there are Rayleigh diffraction caused by Fresnel diffraction, wavefront aberration, and the like in the diffraction aberration, the characteristics of the aberration and the aberration correction method in the Rayleigh diffraction will be described below in the present invention.

When the beam orbit is limited by an objective aperture 214 in order to control the opening angle 213 of an electron beam 212 on a sample 211 using an objective lens 210, the wave nature of electrons becomes strong. As a result, the influence of Fresnel diffraction 215 occurring on the path of the electron beam 212 is increased. As the inclination of the traveling direction of the diffracted wave of the electron beam 212 by the Fresnel diffraction 215 from the beam axis increases, a phase difference occurring within the beam diameter increases. The phenomenon in which the spot shape of the beam on the sample, which is focused by the objective lens 210, expands due to the Fresnel diffraction 215 is Rayleigh diffraction 216. The intensity distribution of the diffracted wave on the sample is attenuated with an amplitude variation due to the Rayleigh diffraction 216 since it changes due to the phase difference within the beam diameter 217 of the electron beam 212 as the inclination of the focusing direction of the electron beam from the axis of the beam increases. In addition, if the beam landing speed of the electron beam 212 becomes a low speed, the wavelength of the electron wave becomes long. Accordingly, since a phase difference within the beam diameter of the diffracted wave caused by the Fresnel diffraction 215 is difficult to occur, attenuation due to diffraction angle of the intensity distribution of the diffracted wave becomes weak. For this reason, the Rayleigh diffraction 216 increases as the acceleration level becomes low. In addition, also in the process in which the electron beam 212 is focused on the sample 211 by the objective lens 210, the electron beam 212 travels while generating the diffracted wave due to the Fresnel diffraction 215. Accordingly, the Rayleigh diffraction 216 is also a phenomenon causing the spot shape expansion of the beam on the sample 211 by interference between the diffracted wave generated on the path of the electron beam 212 up to the objective lens 210 and the diffracted wave generated on the focusing orbit of the electron beam 212 by the objective lens 210.

Figure 3:
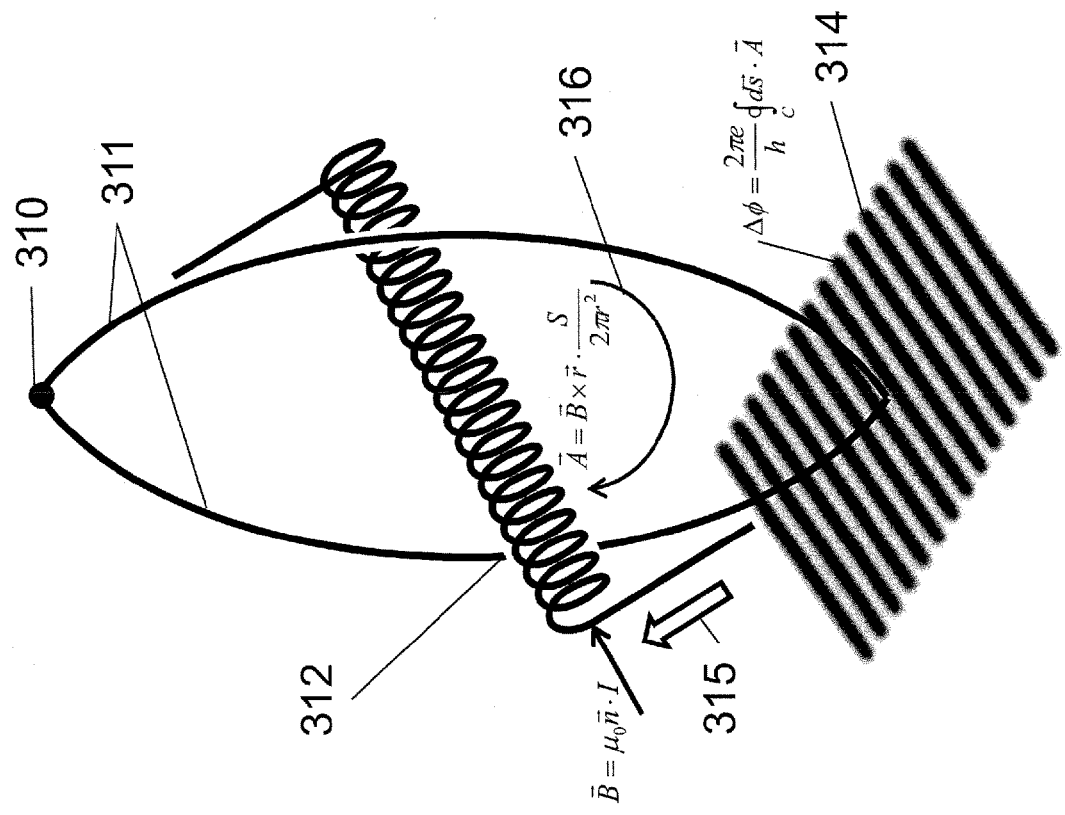
FIG. 3 is an explanatory view of the Aharanov-Bohm effect.

FIG. 3 is an explanatory view of the AB effect used in the phase control of the electron beam. The method of demonstrating the AB effect using the technique of an electron beam holography is a method of observing an interference fringe 314 of an electron beam 311 on a sample 313 using an electron beam control device that divides the electron beam 311 emitted from an electron source 310 into two orbits and focuses the electron beam on the sample 313 after passing through both the sides with a sufficiently long solenoid coil 312 interposed therebetween. When a current 315 is made to flow through the solenoid coil 312, a magnetic field can be induced only in the solenoid coil. In this case, on the outside of the solenoid coil 312 where there is no magnetic field, a vector potential 316 is induced in the rotational direction in inverse proportion to the distance from the center of the axis of the solenoid coil 312. Therefore, since the electron beam 311 having passed through both sides with the axis of the solenoid coil 312 interposed therebetween is influenced by the vector potential 316, the phase of the electron beam is changed. This phenomenon is the AB effect. Accordingly, if the current flowing through the solenoid coil 312 is changed, the phase of the electron beam 311 is changed and the interference fringe 314 of the electron beam on the sample is changed. When demonstrating the AB effect, it is difficult to satisfy the condition, in which no magnetic field or electric field is present, in the solenoid coil 310 with a limited length. For this reason, it has been necessary to suppress the magnetic field leakage by forming the solenoid coil in a donut-shaped ring and make the solenoid coil very fine (several micrometers) because the wavelength of the electron beam is extremely short. In the above-described demonstration, the magnet of a very fine ring was surrounded with a superconducting material so that the leakage of the magnetic field of the magnet was completely prevented by the Meissner effect, and the phase difference between electron beams passing through the inner and outer sides of the ring was observed in the form of interference fringes using electron beam holography. As a result of the observation, it was found that there was a phase difference of only a half wavelength between the orbits of two electron beams, and it was demonstrated that the phase of the electron beam was changed by the vector potential.

Second Embodiment

In a second embodiment, the operation of aberration correction in an example of application to a scanning electron microscope will be described.

Figure 4:
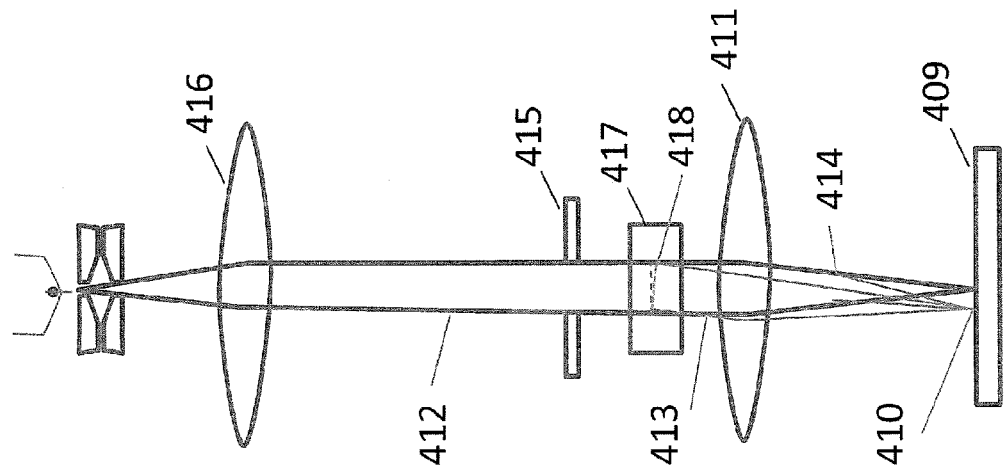
FIG. 4 is a schematic diagram showing a method of correcting the aberration due to Rayleigh diffraction.

FIG. 4 is a schematic diagram showing a method of correcting the aberration due to Rayleigh diffraction. Rayleigh diffraction 410 is a phenomenon causing the spot shape expansion of the beam on a sample 409 by interference between a diffracted wave 413 generated on the path of an electron beam 412 up to an objective lens 411 and a diffracted wave 414 generated on the focusing orbit of the electron beam 412 by the objective lens 411.

Of the Rayleigh diffraction 410, attention is paid to the diffracted wave 413 generated from an objective aperture 415 to the objective lens 411. As a form of the present embodiment, the electron beam 412 from the objective aperture 415 to the objective lens 411 is a collimated beam whose optical orbit is controlled by a condenser lens 416 or the like, and the phase of the electron beam is a plane wave. The phase difference within the beam diameter of the diffracted wave 413 generated up to the objective lens 411 increases depending on the inclination of the traveling direction of the electron beam from the beam axis. Therefore, in order to cause a new phase difference within the beam diameter, a diffraction aberration corrector 417 that induces a vector potential, which is perpendicular to the beam axis and has a symmetrical distribution within the orthogonal plane, is provided between the objective aperture 415 and the objective lens 411. Since the path integral to take an inner product between the electron beam 412, which travels along the beam axis, and the vector potential becomes 0 when the electron beam 412 passes through the diffraction aberration corrector 417, the phase is not changed by the AB effect. Accordingly, even if the electron beam 412 is focused on the sample 409 by the objective lens 411, the beam intensity does not change. On the other hand, the path integral to take an inner product between the diffracted wave 413, which travels in a state of being inclined from the beam axis due to Fresnel diffraction 418, and the vector potential does not become 0. Accordingly, a phase difference may be caused by the AB effect. In this case, if the path integral difference is increased by the distribution of the vector potential within the beam diameter, the phase difference within the beam diameter is increased, and accordingly the Rayleigh diffraction 410 on the sample 409 can be suppressed.

On the other hand, in the process in which the electron beam passes through the diffraction aberration corrector 417 and is focused from the objective lens 411 onto the sample 409, the electron beam travels while generating the diffracted wave 414. The Rayleigh diffraction 410, which is a phenomenon of spot shape expansion of the beam on the sample 409, remains due to the diffracted wave 414. That is, the intensity distribution of the diffracted wave on the sample 409 changes due to the phase difference within the beam diameter caused by the focusing direction of the electron beam 412. In this case, as the inclination of the focusing direction of the electron beam 412 by the Fresnel diffraction 418 from the beam axis increases, the intensity distribution of the diffracted wave on the sample 409 is attenuated with an amplitude variation. Although it is possible to generate a phase difference within the beam diameter efficiently for the electron beam 412 focused by the objective lens 411, it is not corrected from the usability of the electron beam in the present embodiment.

In this case, the diffracted wave of the electron beam 412 on the sample becomes an interference wave between the diffracted wave 414, which is caused by the Fresnel diffraction 418 on the path of the electron beam 412 from the objective aperture 415 to the diffraction aberration corrector 417, and a diffracted wave, which is caused by the Fresnel diffraction 418 on the path of the electron beam 412 until the electron beam 412 passes through the diffraction aberration corrector 417 to the objective lens 411 and is focused on the sample 409. Compared with the Rayleigh diffraction 410 when there is no diffraction aberration corrector 417, the above-described interference wave may have a sharp peak shape.

Third Embodiment

Figure 5A:
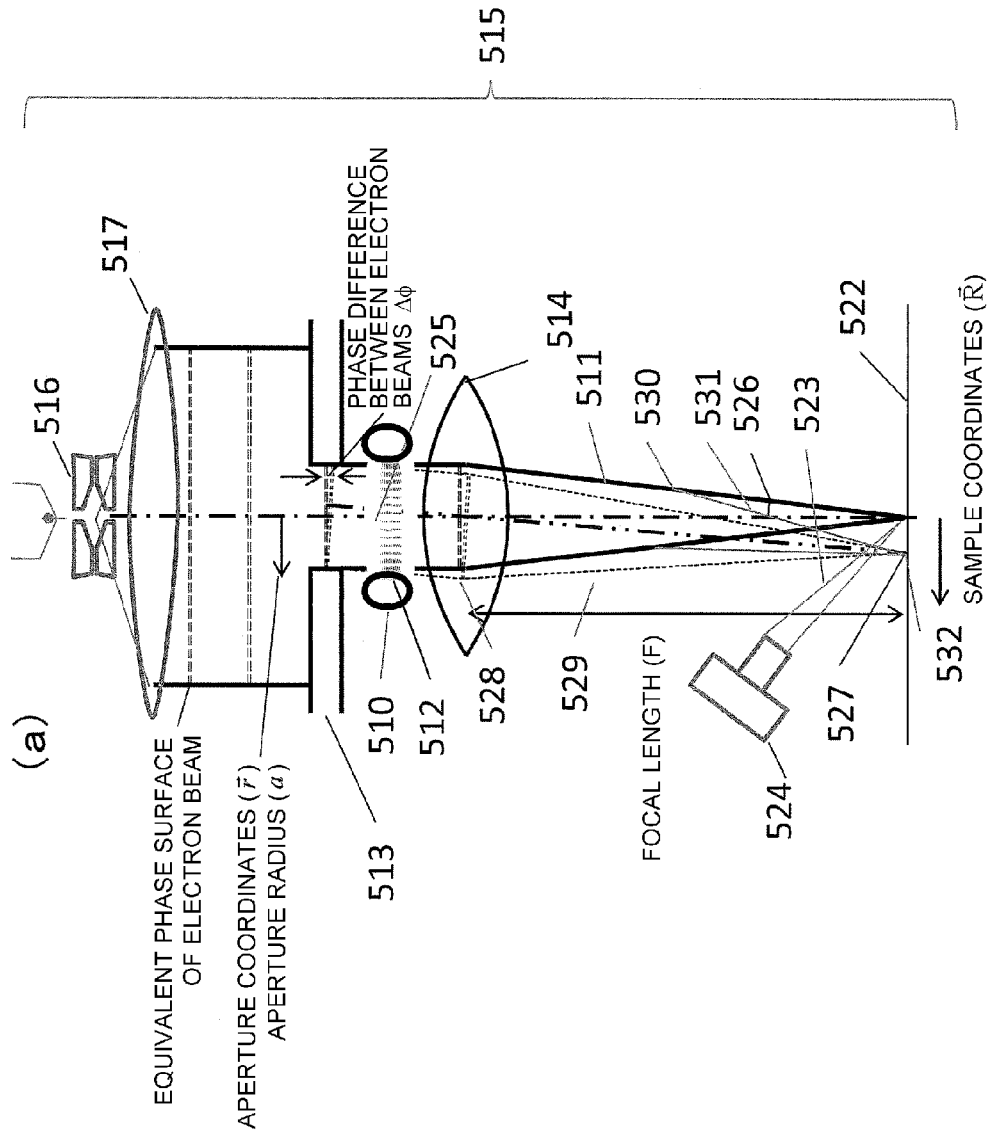
FIG. 5A is a diagram showing a specific method of correcting the Rayleigh diffraction.
Figure 5B:
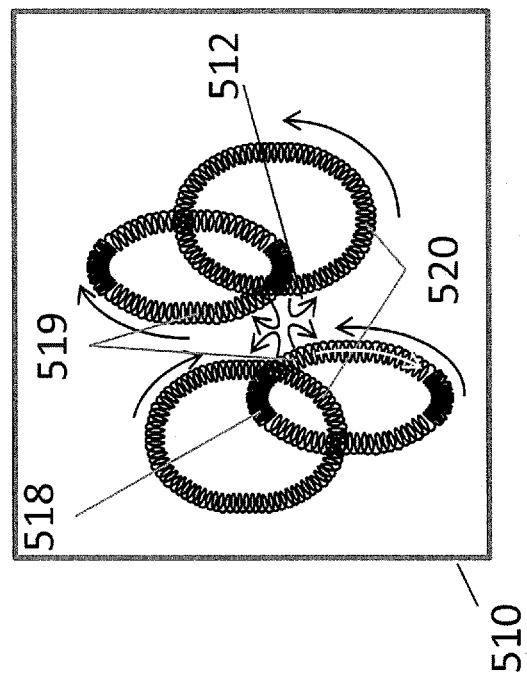
FIG. 5B is an enlarged view of a diffraction aberration corrector.

FIGS. 5A and 5B show a specific method of correcting the Rayleigh diffraction. As described above, a diffraction aberration corrector 510 can induce a vector potential 512 that is parallel to the beam axis of an electron beam 511 and has a symmetrical distribution within the orthogonal plane. An example of the configuration of a scanning electron microscope 515 in which the diffraction aberration corrector 510 is provided will be described below.

This is the scanning electron microscope 515 including: an electron gun 516; an electron beam 511 emitted from the electron gun 516; a condenser lens 517 that controls the focusing and divergence of the electron beam 511; an objective aperture 513 that limits the beam diameter of the electron beam 511; the diffraction aberration corrector 510 in which a pair 519 of poles of vector potentials formed by a cylindrical pipe to form a solenoid coil in a doughnut-shaped ring 518 or a solenoid coil ring are disposed at the positions of the electron beam 511 having passed through the objective aperture 513, which are symmetrical with respect to the beam axis, so that the extension direction of the surface of the solenoid coil ring crosses the beam axis, another pair 520 of poles of vector potentials are disposed at the positions, at which the relative angles with respect to the poles of the two vector potential are 90° so that the extension direction of the surface of the solenoid coil ring crosses the beam axis, and a quadrupole of the vector potential is disposed so that the rings of the magnetic flux induced in the four solenoid coils of the vector potential are axisymmetrically induced; an objective lens 514 that focuses the electron beam 511 on a sample 521; a deflector 522 that deflects the electron beam 511; and a detector 524 that detects a secondary particle 523 generated from the sample 521 by irradiation of the electron beam 511. Here, the diffraction aberration corrector 510 is provided between the objective aperture 513 and the objective lens 514. In addition, if an aberration corrector that corrects the optical aberration, such as a chromatic aberration or a spherical aberration, is added between the diffraction aberration corrector 510 and the objective aperture 513, it is possible to focus the electron beam 511 on the sample 522 more densely. When a deflector is placed between the objective lens 514 and the sample 522, it is also possible to superimpose the objective lens 514 and the diffraction aberration corrector 510.

The diffraction aberration corrector 510 induces not only the vector potential induced by the magnetic flux in the solenoid coil but also the vector potential by the ring of the magnetic flux leaking from the solenoid coil to the beam axis. The vector potential induced by the magnetic flux in the solenoid coil ring does not cause a phase difference as long as the electron beam 511 does not cross the solenoid coil. On the other hand, the vector potential induced in the ring of the leaking magnetic flux forms a quadrupole, and induces a vector potential distribution that is symmetrical along the beam axis and is also symmetrical with respect to the beam axis. In a central portion 525 of the quadrupole of the vector potential, the distribution of the vector potential within a plane perpendicular to the beam axis is the distribution that is symmetrical with respect to the beam axis. In FIG. 5B, the polar coordinates within the orthogonal plane with respect to the beam axis are assumed to be [Expression 1].

$$\vec{r} = (r\cos(\theta), r\sin(\theta)) \quad \text{[Expression 1]}$$

Then, (Expression 2) and (Expression 3) are obtained due to the limitation of the beam diameter having passed the objective aperture 513, and the vector potential distribution becomes (Expression 4).

$$0 \leq r \leq a \quad \text{[Expression 2]}$$

$$0 \leq \theta \leq 2\pi \quad \text{[Expression 3]}$$

$$(A'r\sin(\theta), A'r\cos(\theta)) \quad \text{[Expression 4]}$$

In addition, if the number of poles of the vector potential is increased by forming a ring rotating around the beam axis with a cylinder obtained by spirally winding the solenoid coil, the vector potential distribution becomes a rotationally symmetrical consecutive pole (Expression 5) that surrounds the beam axis.

$$(-A'r\sin(\theta), A'r\cos(\theta)) \quad \text{[Expression 5]}$$

In this case, since the ring of the magnetic flux leaking to the beam axis is parallel to the beam axis, it does not affect the phase of the electron beam 511 traveling in a straight line. However, since a first diffracted wave 529 that is caused by Fresnel diffraction 528 on the first path and travels in a state of being inclined from the beam axis passes through the ring of the magnetic flux, it causes a phase difference by the amount of the pole of the vector potential. Therefore, the phase difference of the electron beam 511 generated in the central portion 525 of the consecutive pole of the vector potential becomes [Expression 6].

$$\Delta\phi(\vec{r}, \vec{R}) = \frac{2\pi\alpha}{\lambda a}\vec{r}\cdot\vec{R} + \frac{2\pi e\alpha}{h a}\oint ds\vec{A}\cdot\vec{R} \quad \text{[Expression 6]}$$

$$= \frac{2\pi\alpha}{\lambda a}((r\cos(\theta), r\sin(\theta)) +$$

$$= (-A'r\sin(\theta), A'r\cos(\theta)))\cdot(X, Y)$$

$$\frac{2\pi\alpha A''}{\lambda a}(Xr\sin(\theta+\beta) + Yr\cos(\theta+\beta))$$

$$\therefore A'' \gg 1, \cos(\beta) = \frac{A'}{\sqrt{A'^2+1}}$$

Here, (Expression 7) is the coordinates of the sample 521, and a is a beam opening angle 526 on a sample. In this case, the wave function of the electron beam 511 on the sample is (Expression 8).

$$\vec{R} = (X, Y) \quad \text{[Expression 7]}$$

$$\Phi(\vec{R}) = \int_S \int d\theta r\, dr\, e^{i\Delta\phi} = \quad \text{[Expression 8]}$$

$$2\int_0^1 du J_0\left(\frac{2\pi\alpha A'' Ru}{\lambda}\right) u = \frac{2J_1\left(\frac{2\pi A'' R}{D}\right)}{\frac{2\pi A'' R}{D}} \quad \because D = \frac{\lambda}{\alpha}$$

Here, λ is a wavelength of the electron beam 511, and $J_1()$ and $J_0()$ are Bessel functions.

Rayleigh diffraction 527 of the electron beam 511 on the sample 521 becomes an interference wave between the first diffracted wave 529 of (Expression 8) caused by the Fresnel diffraction 528 on the first path of the electron beam 511 from the objective aperture 513 to the diffraction aberration corrector 510 and a second diffracted wave 531 caused by Fresnel diffraction 530 on the second path of the electron beam 511 until the electron beam 511 passes through the diffraction aberration corrector 510 to the objective lens 514 and is focused on the sample 521. In this case, the wave function of the Rayleigh diffraction 527 of the electron beam 511 on the sample is (Expression 9).

$$\Phi_{total}(\vec{R}) = \int_S \int d\theta r\, dr(L_C e^{i\Delta\phi} + L_F e^{i\Delta\phi_F}) = \quad \text{[Expression 9]}$$

$$2\int_0^1 du\left[L_C J_0\left(\frac{2\pi\alpha A'' Ru}{\lambda}\right) + L_F J_0\left(\frac{2\pi\alpha u}{\lambda}\right)\right] u$$

$$= \frac{2L_C J_1\left(\frac{2\pi A'' R}{D}\right)}{\frac{2\pi A'' R}{D}} + \frac{2L_F J_1\left(\frac{2\pi R}{D}\right)}{\frac{2\pi R}{D}}$$

$$\therefore \Delta\phi_F(\vec{r}, \vec{R}) = \frac{2\pi\alpha}{\lambda a}\vec{r}\cdot\vec{R}$$

$L_C$ is a normalization factor of the first diffracted wave 529 caused by the Fresnel diffraction 528 on the first path of the electron beam 511 from the objective aperture 513 to the diffraction aberration corrector 510, and $L_F$ is a normalization factor of the second diffracted wave 531 caused by the Fresnel diffraction 530 on the second path of the electron beam 511 until the electron beam 511 passes through the diffraction aberration corrector 510 to the objective lens 514 and is focused on the sample 521. For comparison, the wave function of conventional Rayleigh diffraction 532 when there is no diffraction aberration corrector is [Expression 10].

$$\Phi_{total}(\vec{R}) = \int_S \int d\theta r\, dr(L e^{i\Delta\phi_F}) = \quad \text{[Expression 10]}$$

$$2\int_0^1 du\left[L J_0\left(\frac{2\pi\alpha u}{\lambda}\right)\right] u = \frac{2L J_1\left(\frac{2\pi R}{D}\right)}{\frac{2\pi R}{D}}$$

Here, L is a normalization factor.

Figure 6:
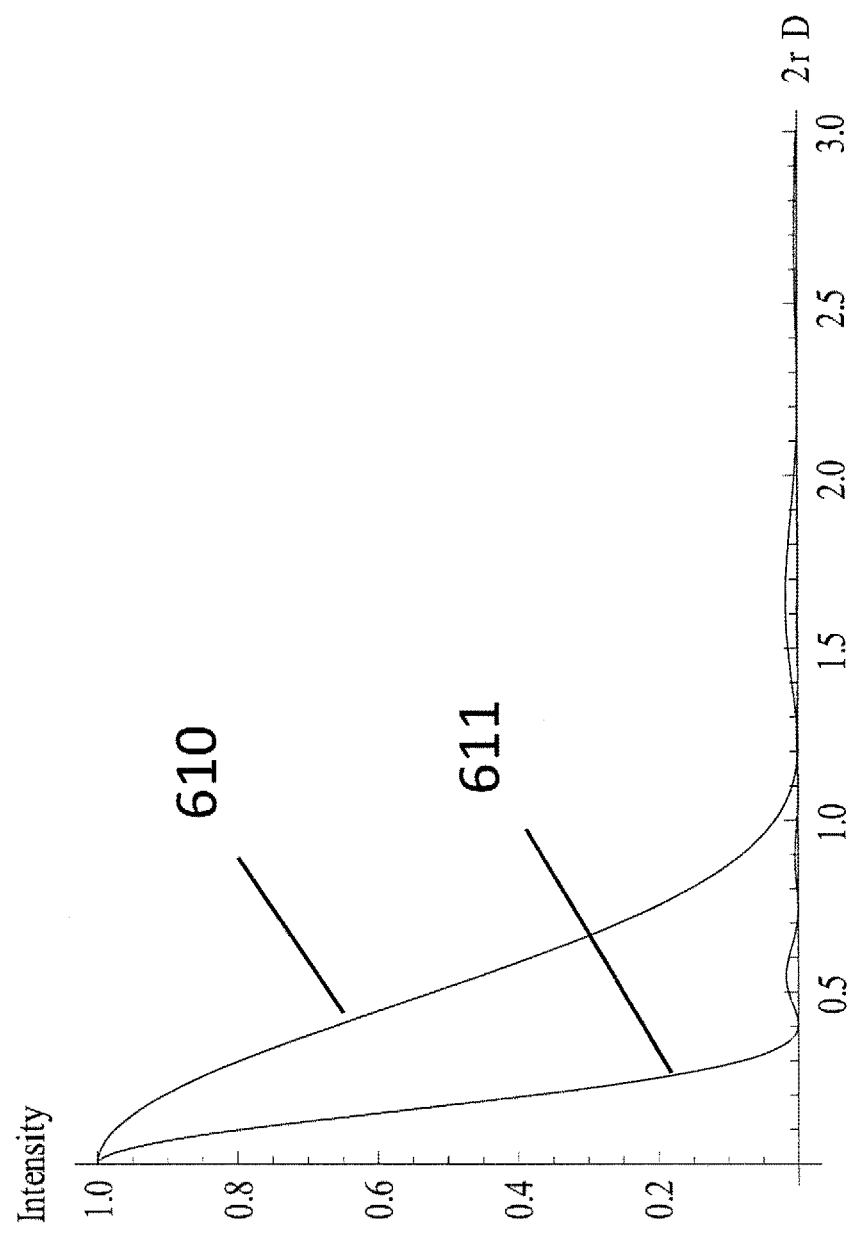
FIG. 6 is a diagram showing the beam intensity distribution on a sample.

FIG. 6 is a diagram showing the beam intensity distribution on a sample. The square of the wave function (Expression 9) of the Rayleigh diffraction of the electron beam on the sample is a beam intensity distribution 611 after diffraction aberration correction. The square of the wave function (Expression 10) of the conventional Rayleigh diffraction when there is no diffraction aberration corrector is a beam intensity distribution 610 before diffraction aberration correction.

The horizontal axis is an axis scaled by the wavelength of the electron beam and the beam opening angle on the sample when the distance from the beam axis on the sample is assumed to be r. In the curve of the beam intensity distribution 610 before diffraction aberration correction, a point crossing the horizontal axis at 0.61 D is a point indicating the Rayleigh resolution which is a basic characteristic of the diffraction aberration. When the corrector is appropriately set, the interference wave may have a sharp peak shape, compared with the Rayleigh diffraction when there is no diffraction aberration corrector. In this case, the curve of the beam intensity distribution after diffraction aberration correction is when A"=3, and the peak of beam intensity distribution is sharp. In addition, the shape of the beam intensity distribution becomes a sharp peak if A" is appropriately set.

Fourth Embodiment

Figure 7:
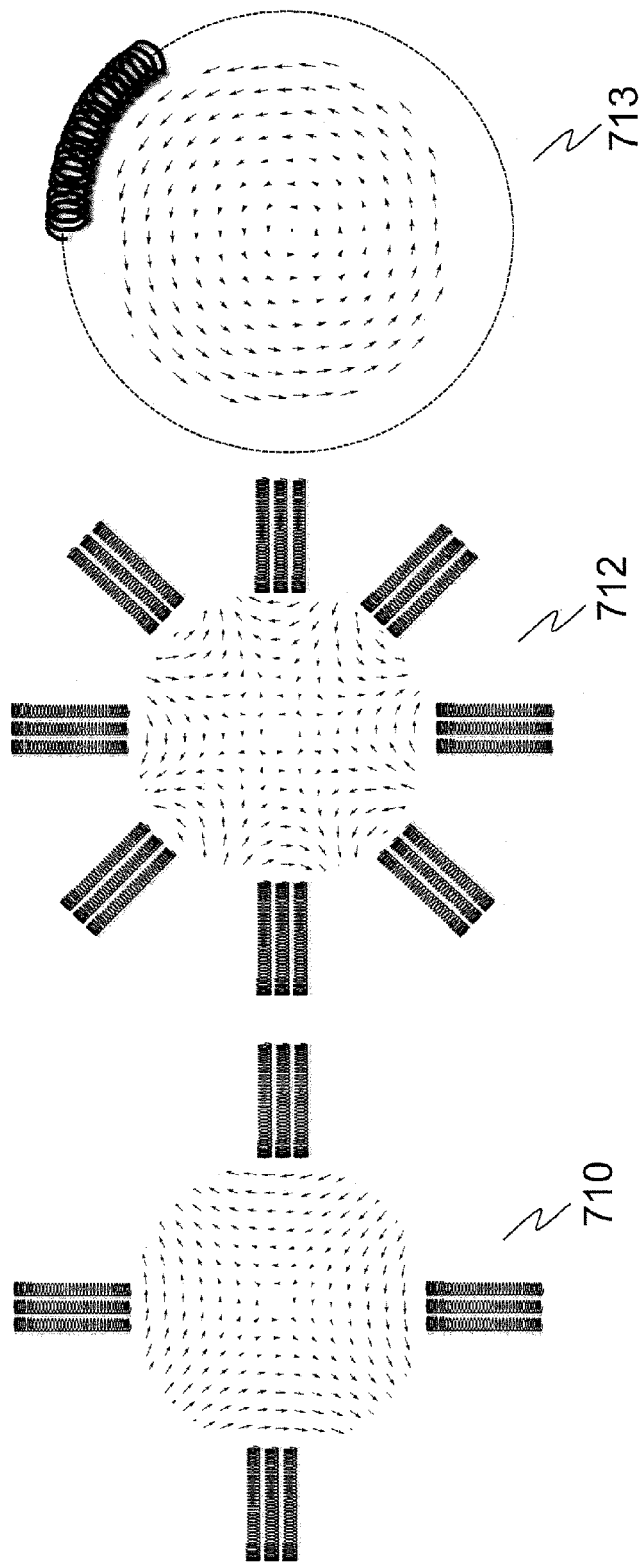
FIG. 7 is a diagram showing an example of the arrangement of poles of the vector potential of the diffraction aberration corrector.

FIG. 7 is an example of the arrangement of poles of the vector potential of a diffraction aberration corrector. This is an example of the arrangement of a cylindrical pipe to form a solenoid coil with a doughnut-shaped ring or a solenoid coil ring or a pair of poles of the vector potential formed by a pair of magnet rings or the like. Although a quadrupole 710 of the vector potential is adopted in the above-described embodiment, it is possible to suppress the spread of the vector potential in a beam axis direction by setting an octapole 712, 12-pole, and 16-pole of the vector potential. On the other hand, if a consecutive pole 713 of the vector potential to form a ring rotating around the beam axis with a cylinder obtained by spirally winding the solenoid coil is used, rotational symmetry of the vector potential becomes better.

Fifth Embodiment

Figure 8:
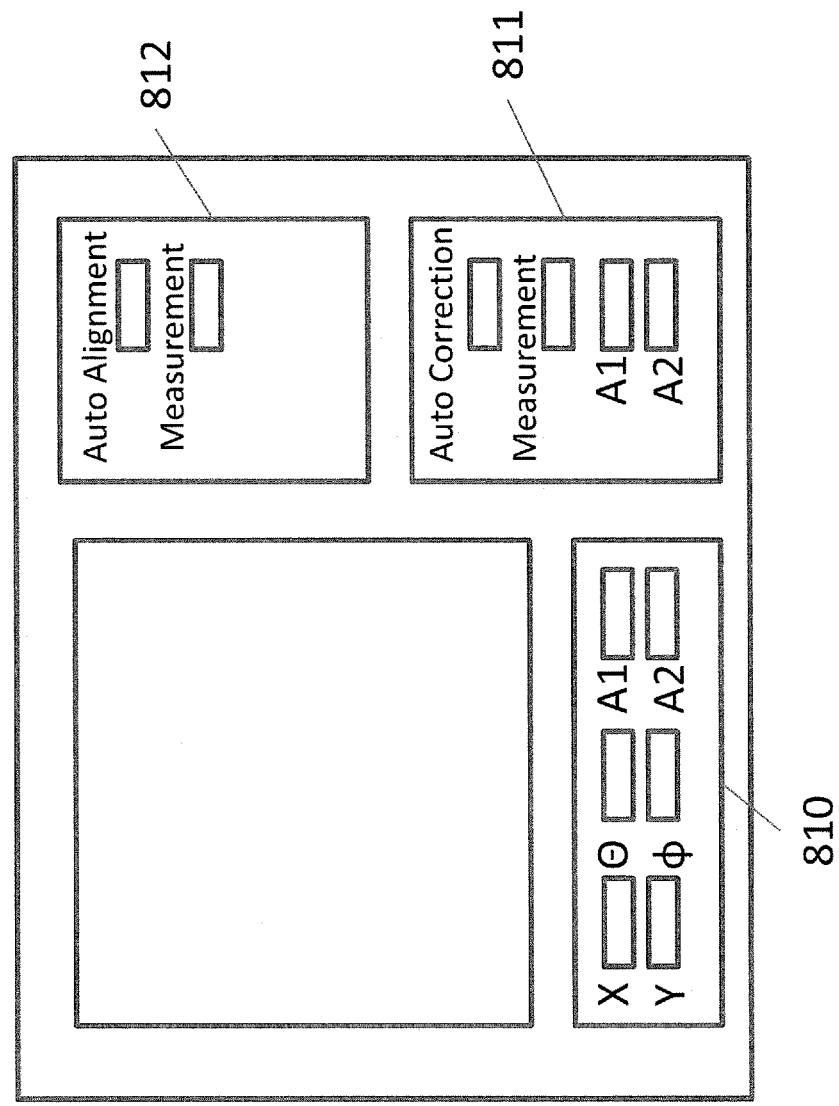
FIG. 8 is a diagram showing an example of the control screen of the diffraction aberration corrector.

FIG. 8 is an example of a control screen of a diffraction aberration corrector. This is formed by a screen 810 that displays the axis control value of the multipole of the vector potential for each combination of acceleration of the electron beam, current, and the opening angle at the time of beam focusing, a screen 811 to measure or register the axis control value, a screen 812 indicating the alignment of multiple poles of the vector potential, and the like.

Sixth Embodiment

Figure 9:
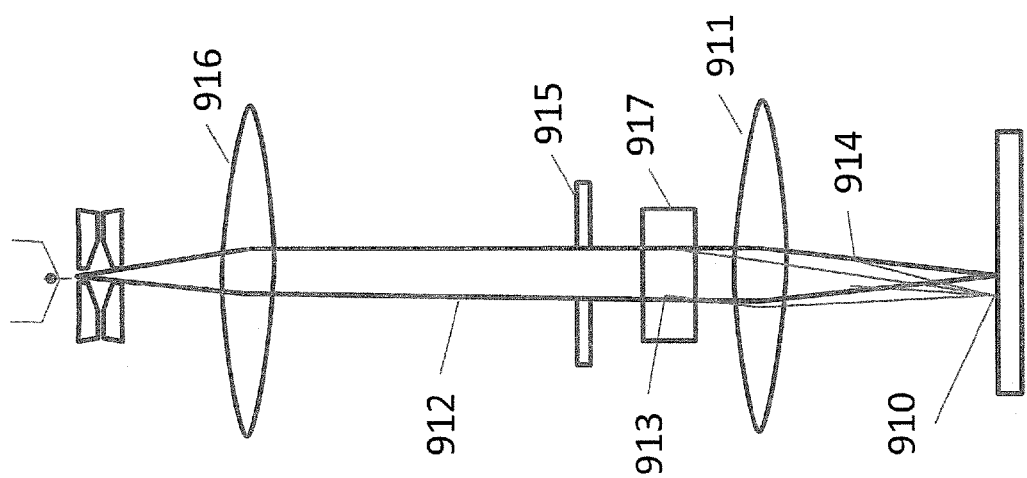
FIG. 9 is a diagram showing an embodiment in which the diffraction aberration corrector is applied to an ion microscope.

FIG. 9 is an example in which the diffraction aberration corrector is applied to an ion microscope. Rayleigh diffraction 910 is a phenomenon causing the spot shape expansion of the beam on a sample by interference between a diffracted wave 913 generated on the path of an ion beam 912 up to an objective lens 911 and a diffracted wave 914 generated on the focusing orbit of the ion beam 912 by the objective lens 911.

First, of the Rayleigh diffraction 910, attention is paid to the diffracted wave 913 generated from a beam limiting aperture 915 to the objective lens 911. As a form of the present embodiment, the ion beam 912 from the beam limiting aperture 915 to the objective lens 911 becomes a collimated beam by controlling the optical orbit using a condenser lens 916 or the like, and the phase of the ion beam is a plane wave. The phase difference within the beam diameter of the diffracted wave 913 generated up to the objective lens 911 increases depending on the inclination of the traveling direction of the ion beam from the beam axis. Therefore, in order to cause a new phase difference within the beam diameter, a diffraction aberration corrector 917 that induces a vector potential, which is perpendicular to the beam axis and has a symmetrical distribution within the orthogonal plane, is provided between the beam limiting aperture 915 and the objective lens 911. Since the path integral to take an inner product between the ion beam, which travels along the beam axis, and the vector potential becomes 0 when the ion beam passes through the diffraction aberration corrector 917, the phase is not changed by the AB effect. Accordingly, even if the ion beam is focused on the sample by the objective lens, the beam intensity does not change. On the other hand, the path integral to take an inner product between the diffracted wave, which travels in a state of being inclined from the beam axis due to Fresnel diffraction, and the vector potential does not become 0. Accordingly, a phase difference may be caused by the AB effect. Therefore, if the path integral difference is increased by the distribution of the vector potential within the beam diameter, the phase difference within the beam diameter is increased, and accordingly the Rayleigh diffraction on the sample can be suppressed. An optical aberration corrector that corrects the optical aberration, such as a chromatic aberration or a spherical aberration, may be disposed between the beam limiting aperture 915 and the diffraction aberration corrector 917. In addition, it is also possible to obtain a high-resolution transmission image by detecting the electron beam having passed through the sample.

Seventh Embodiment

Figure 10:
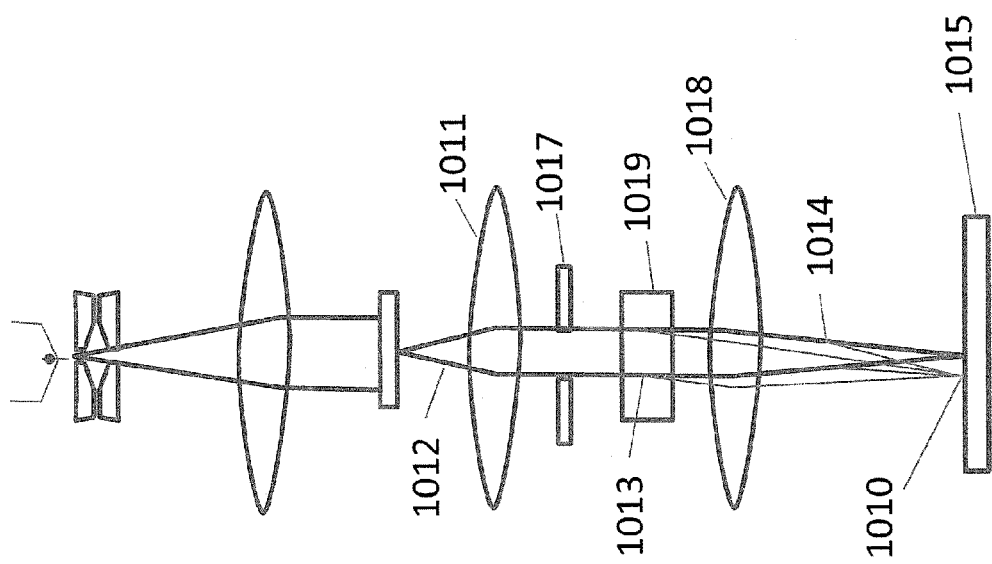
FIG. 10 is a diagram showing an embodiment in which the diffraction aberration corrector is applied to a transmission electron microscope.

FIG. 10 is an example in which the diffraction aberration corrector is applied to a transmission electron microscope. Rayleigh diffraction 1010 is a phenomenon causing an image blur on an imaging surface 1015 of the transmission electron or a contrast fluctuation in a detector by interference between a diffracted wave 1013 generated on the path of a transmission electron beam 1012 after passing through an objective lens 1011 and a diffracted wave 1014 generated on the focusing orbit of the transmission electron beam 1012 by the objective lens 1011.

Of the Rayleigh diffraction 1010, attention is paid to the diffracted wave 1013 generated from an objective aperture 1017 to the imaging surface 1015 or the detector. As a form of the present embodiment, the transmission electron beam 1012 from the objective aperture 1017 to the imaging surface 1015 becomes a collimated beam by controlling the optical orbit using a transfer lens 1018, and the phase of the transmission electron beam 1012 is a plane wave. The phase difference within the beam diameter of the diffracted wave 1013 generated on the path of the transmission electron beam 1012 after passing through the objective aperture 1017 increases depending on the inclination from the beam axis. Therefore, in order to cause a new phase difference within the beam diameter, a diffraction aberration corrector 1019 that induces a vector potential, which is perpendicular to the beam axis and has a symmetrical distribution within the orthogonal plane, is provided between the objective aperture 1017 and the imaging surface 1015 or the detector. Since the path integral to take an inner product between the transmission electron beam 1012, which travels along the beam axis, and the vector potential becomes 0 when the transmission electron beam 1012 passes through the diffraction aberration corrector 1019, the phase is not changed by the AB effect. Accordingly, the beam intensity of the transmission electron beam 1012 having passed the objective aperture 1017 does not change. On the other hand, the path integral to take an inner product between the diffracted wave, which travels in a state of being inclined from the beam axis due to Fresnel diffraction, and the vector potential does not become 0. Accordingly, a phase difference may be caused by the AB effect. Therefore, if the path integral difference is increased by the distribution of the vector potential within the beam diameter, the phase difference within the beam diameter is increased, and accordingly it is possible to suppress the Rayleigh diffraction 1010 on the imaging surface 1015 or in the detector. An optical aberration corrector may be disposed between the objective aperture 1017 and the diffraction aberration corrector 1019.

Eighth Embodiment

Figure 11:
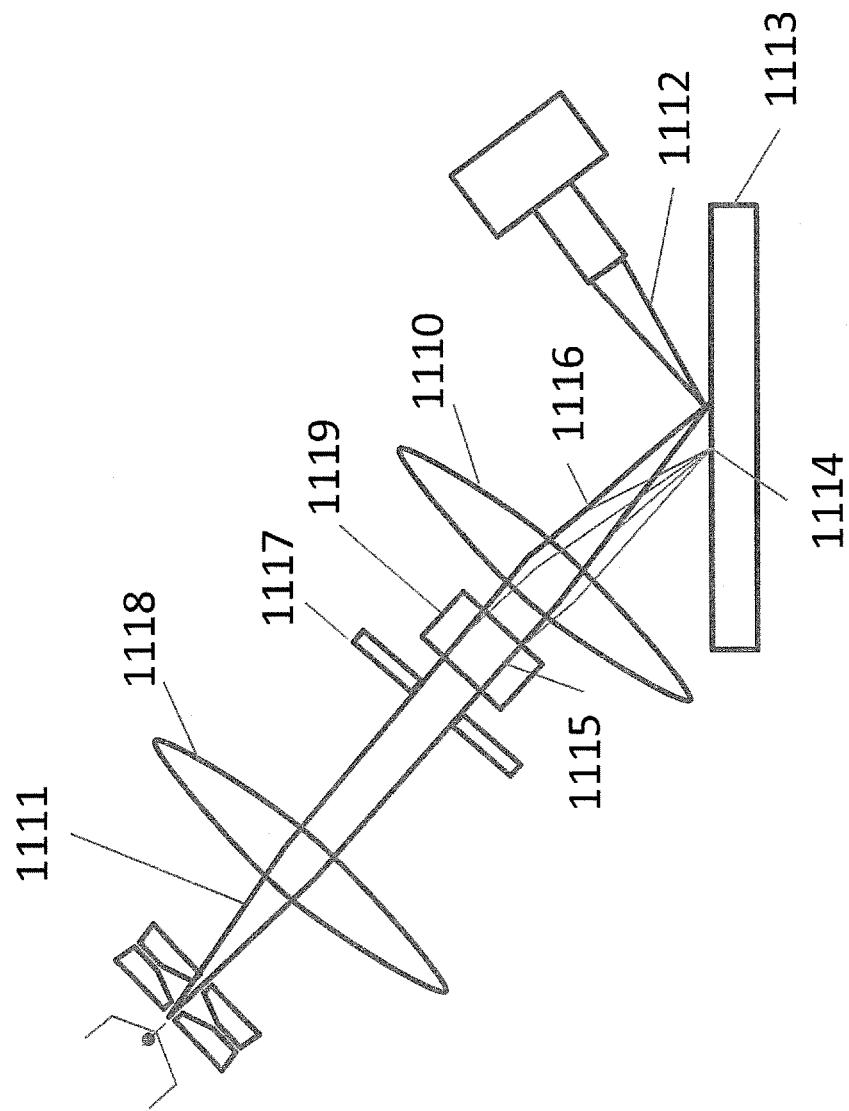
FIG. 11 is a diagram showing an embodiment in which the diffraction aberration corrector is applied to a reflection electron microscope.

FIG. 11 is an example in which the diffraction aberration corrector is applied to a reflection electron microscope. In the reflection electron microscope, since the focusing orbit of an electron beam 1111 by an objective lens 1110 is different from that in the scanning electron microscope, a sample 1113 is inclined in order to detect a reflection electron 1112. However, Rayleigh diffraction 1114 causes the spot shape expansion of the beam on a sample, which is inclined from the beam axis, by interference between a diffracted wave 1115 generated on the path of the electron beam 1111 up to the objective lens 1110 and a diffracted wave 1116 generated on the focusing orbit of the electron beam 1111 by the objective lens 1110.

Of the Rayleigh diffraction 1114, attention is paid to the diffracted wave 1115 generated from an objective aperture 1117 to the objective lens 1110. As a form of the present embodiment, the electron beam 1111 from the objective aperture 1117 to the objective lens 1110 becomes a collimated beam by controlling the optical orbit using a condenser lens 1118 or the like, and the phase of the electron beam 1111 is a plane wave. The phase difference within the beam diameter of the diffracted wave 1115 generated up to the objective lens 1110 increases depending on the inclination of the electron beam 1111 from the beam axis. Therefore, in order to cause a new phase difference within the beam diameter, a diffraction aberration corrector 1119 that induces a vector potential, which is perpendicular to the beam axis and has a symmetrical distribution within the orthogonal plane, is provided between the objective aperture 1117 and the objective lens 1110. Since the path integral to take an inner product between the electron beam 1111, which travels along the beam axis, and the vector potential becomes 0 when the electron beam 1111 passes through the diffraction aberration corrector 1119, the phase is not changed by the AB effect. Accordingly, even if the electron beam 1111 is focused on the sample by the objective lens, the beam intensity does not change. On the other hand, the path integral to take an inner product between the diffracted wave, which travels in a state of being inclined from the beam axis due to Fresnel diffraction, and the vector potential does not become 0. Accordingly, a phase difference may be caused by the AB effect. Therefore, if the path integral difference is increased by the distribution of the vector potential within the beam diameter, the phase difference within the beam diameter is increased, and accordingly the Rayleigh diffraction 1114 on the sample can be suppressed. An optical aberration corrector may be disposed between the objective aperture 1117 and the diffraction aberration corrector 1119.

Ninth Embodiment

Figure 12:
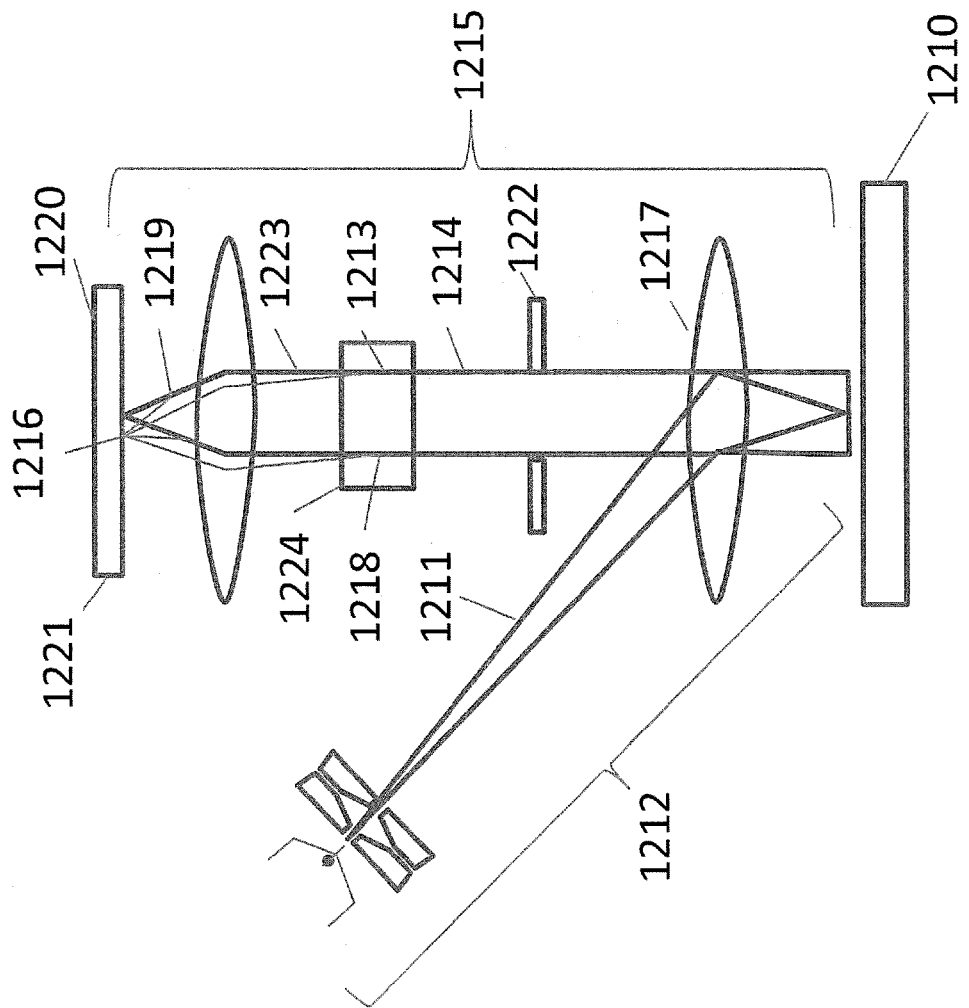
FIG. 12 is a diagram showing an embodiment in which the diffraction aberration corrector is applied to a mirror electron microscope.

FIG. 12 is an example in which the diffraction aberration corrector is applied to a mirror electron microscope. The mirror electron microscope is formed by an irradiation optical system 1212, which emits an electron beam 1211 to a sample 1210 in parallel, and a projection optical system 1215, which images a mirror electron beam 1213 or a reflection electron beam 1214 from the sample 1210. Rayleigh diffraction 1216 of the irradiation optical system 1215 is a phenomenon causing an image blur on an imaging surface 1220 of the mirror electron or a contrast fluctuation in a detector 1221 by interference between a diffracted wave 1218 generated on the path of a mirror electron beam 1213 after passing through an objective lens 1217 and a diffracted wave 1219 generated on the focusing orbit of the mirror electron beam 1213 by the objective lens 1217. Here, the Rayleigh diffraction caused when imaging the reflection electron beam 1214 is equivalent to that caused in the case of the mirror electron beam 1213, the case of the mirror electron beam 1213 can be applied to the present embodiment unless otherwise specified.

Of the Rayleigh diffraction 1216, attention is paid to the diffracted wave 1218 generated from an objective aperture 1222 to the imaging surface 1220 or the detector 1221. As a form of the present embodiment, the mirror electron beam 1213 from the objective aperture 1222 to the imaging surface 1220 or the detector 1221 is a collimated beam by controlling the optical orbit using a transfer lens 1223, and the phase of the mirror electron beam 1213 is a plane wave. The phase difference within the beam diameter of the diffracted wave 1219 generated on the path of the mirror electron beam 1213 after passing through the objective aperture 1017 increases depending on the inclination from the beam axis. Therefore, in order to cause a new phase difference within the beam diameter, a diffraction aberration corrector 1224 that induces a vector potential, which is perpendicular to the beam axis and has a symmetrical distribution within the orthogonal plane, is provided between the objective aperture 1222 and the imaging surface 1220 or the detector 1221. Since the path integral to take an inner product between the mirror electron beam 1213, which travels along the beam axis, and the vector potential becomes 0 when the mirror electron beam 1213 passes through the diffraction aberration corrector 1224, the phase is not changed by the AB effect. Accordingly, the beam intensity of the mirror electron beam 1213 having passed the objective aperture 1222 does not change. On the other hand, the path integral to take an inner product between the diffracted wave, which travels in a state of being inclined from the beam axis due to Fresnel diffraction, and the vector potential does not become 0. Accordingly, a phase difference may be caused by the AB effect. Therefore, if the path integral difference is increased by the distribution of the vector potential within the beam diameter, the phase difference within the beam diameter is increased, and accordingly it is possible to suppress the Rayleigh diffraction 1216 on the imaging surface 1220 or in the detector 1221. An optical aberration corrector may be disposed between the objective aperture 1222 and the diffraction aberration corrector 1224.

REFERENCE SIGNS LIST

- 101: vacuum housing
- 102: electron optical system
- 103: electron optical system control device
- 104: host computer
- 105: console
- 106: display means
- 110: electron beam
- 111: electron source
- 112: objective aperture
- 113: aberration corrector
- 114: diffraction aberration corrector
- 115: deflector
- 116: combined immersion lens of magnetic field and electrostatic field
- 117: sample
- 118: secondary particle
- 119: booster magnetic path member
- 120: reflecting member
- 121: third particle
- 122: central detector
- 130: extraction electrode
- 131: acceleration electrode
- 132: coil
- 133: control magnetic path member 134: yoke member
135: control magnetic path power supply
136: stage
137: stage power supply
210: objective lens
211: on sample
212: electron beam
213: opening angle
214: objective aperture
215: Fresnel diffraction
216: Rayleigh diffraction
217: within beam diameter
310: electron source
311: electron beam
312: solenoid coil
313: on sample
314: interference fringe
315: current
316: vector potential
409: on sample
410: Rayleigh diffraction
411: objective lens
412: electron beam
413: diffracted wave
414: diffracted wave
415: objective aperture
416: condenser lens
417: diffraction aberration corrector
418: Fresnel diffraction
510: diffraction aberration corrector
511: electron beam
512: vector potential
513: objective aperture
514: objective lens
515: scanning electron microscope
516: electron gun
517: condenser lens
518: solenoid coil
519: pair of poles of vector potentials
520: another pair of poles of vector potentials
522: on sample
523: secondary particle
524: detector
525: central portion of quadrupole of vector potential
526: beam opening angle on sample
527: Rayleigh diffraction
528: Fresnel diffraction on first path
529: first diffracted wave
530: Fresnel diffraction on second path
531: second diffracted wave
533: conventional Rayleigh diffraction
610: beam intensity distribution after diffraction aberration correction
611: beam intensity distribution before diffraction aberration correction
710: quadrupole of vector potential
712: octapole of vector potential
713: consecutive pole of vector potential
810: screen that displays axis control value of multipole of vector potential
811: screen to measure or register axis control value
812: screen to instruct alignment of multipole of vector potential
910: Rayleigh diffraction
911: objective lens
912: ion beam
913: diffracted wave
914: diffracted wave generated on focusing orbit
915: beam limiting aperture
916: condenser lens
917: diffraction aberration corrector
1010: Rayleigh diffraction
1011: objective lens
1012: transmission electron beam
1013: diffracted wave
1014: diffracted wave generated on focusing orbit
1015: imaging surface
1017: objective aperture
1018: transfer lens
1019: diffraction aberration corrector
1020: Fresnel diffraction
1110: objective lens
1111: electron beam
1112: reflection electron
1113: sample
1114: Rayleigh diffraction
1115: diffracted wave
1116: diffracted wave generated on focusing orbit
1117: objective aperture
1118: condenser lens
1119: diffraction aberration corrector
1210: sample
1211: electron beam
1212: irradiation optical system
1213: mirror electron beam
1214: reflection electron beam
1215: projection optical system
1216: Rayleigh diffraction
1217: objective lens
1218: diffracted wave
1219: diffracted wave generated on focusing orbit
: imaging surface
1221: detector
1222: objective aperture
1223: transfer lens
1224: diffraction aberration corrector

The invention claimed is:

1. A diffraction aberration correction device comprising:
a charged particle gun emitting a charged particle beam;
an objective aperture that limits a beam diameter of the charged particle beam;
a diffraction aberration corrector in which a first pair of poles of two vector potentials are disposed at positions symmetrical with respect to a beam axis of a charged particle beam having passed through the objective aperture, the first pair of poles inducing a vector potential in a first direction which is perpendicular to the beam axis, the first pair of poles being disposed and configured so as to be rotationally symmetrical with respect to the first direction, and in which a second pair of poles of vector potentials are disposed at positions at which relative angles with respect to the first pair of the two vector potentials are 90°, the second pair of poles inducing a vector potential in a second direction which is perpendicular to the beam axis, the second pair of poles being disposed and configured so as to be rotationally symmetrical with respect to the second direction;
an objective lens that focuses the charged particle beam on a sample;
a deflector that deflects the charged particle beam; and
a detector that detects a secondary particle generated from a sample by irradiation of the charged particle beam.

2. The diffraction aberration correction device according to claim 1, wherein the diffraction aberration corrector includes multiple poles of vector potentials having a number of poles of a multiple of 4, the poles being disposed along a rotation direction around the beam axis at positions symmetrical with respect to the beam axis.

3. The diffraction aberration correction device according to claim 1,
wherein the diffraction aberration corrector includes a solenoid coil spirally wound along a circle surrounding the beam axis.

4. The diffraction aberration correction device according to claim 1,
wherein the diffraction aberration corrector has a function of correcting a degree of orthogonality or axial shift of the charged particle beam with respect to the beam axis.

5. The diffraction aberration correction device according to claim 2,
wherein the diffraction aberration correction device has a function of correcting a degree of orthogonality or axial shift of the charged particle beam with respect to the beam axis.

6. The diffraction aberration correction device according to claim 3,
wherein the diffraction aberration correction device has a function of correcting a degree of orthogonality or axial shift of the charged particle beam with respect to the beam axis.

7. A diffraction aberration correction device comprising:
a charged particle gun emitting a charged particle beam;
an objective aperture that limits a beam diameter of the charged particle beam;
a diffraction aberration corrector that induces a vector potential in a direction, within an orthogonal plane which is perpendicular to a beam axis of the charged particle beam having passed through the objective aperture, and has a distribution symmetrical with respect to the beam axis within the orthogonal plane;
an objective lens that focuses the charged particle beam on a sample;
a deflector that deflects the charged particle beam; and
a detector that detects a secondary particle generated from the sample by irradiation of the charged particle beam.

8. The diffraction aberration correction device according to claim 7,
wherein the diffraction aberration corrector is formed by arranging a ring formed of a solenoid coil, a magnet, or a pair of poles of a vector potential, which is formed by superimposing a plurality of solenoid coil rings or magnet rings, at positions symmetrical with respect to the beam axis of the charged particle beam around a rotational direction of the beam axis, the solenoid coil rings or the magnet rings being disposed perpendicular to the beam axis.

9. A diffraction aberration correction device comprising:
a charged particle gun emitting a charged particle beam;
an objective aperture that limits a beam diameter of the charged particle beam;
a diffraction aberration corrector including a solenoid coil arrangement with multiple turns and having a function of correcting a degree of orthogonality or axial shift of the charged particle beam with respect to a beam axis, the solenoid coil arrangement being disposed along a circle surrounding the beam axis so as to allow the charged particle beam to pass through a space disposed inwardly of the solenoid coil arrangement the beam axis being outside of the turns of the solenoid coil arrangement;
an objective lens that focuses the charged particle beam on a sample;
a deflector that deflects the charged particle beam; and
a detector that detects a secondary particle generated from the sample by irradiation of the charged particle beam.

10. A diffraction aberration correction device comprising:
an electron gun emitting an electron beam;
a sample to which the electron beam is emitted;
an objective lens through which a transmission electron beam having passed through the sample passes;
an objective aperture that limits a shape of the transmission electron beam having passed through the objective lens;
a diffraction aberration corrector that controls a diffracted wave of the transmission electron beam which has passed through the objective aperture and whose shape is limited, the diffraction aberration corrector including a solenoid coil arrangement with multiple turns disposed along a circle surrounding the beam axis so as to allow the charged particle beam to pass through a space disposed inwardly of the solenoid coil arrangement the beam axis being outside of the turns of the solenoid coil arrangement; and
a detector that detects the transmission electron beam having passed through the diffraction aberration corrector or an imaging optical system that images the transmission electron beam having passed through the diffraction aberration corrector.

* * * * *